US010529605B2

(12) United States Patent
Nakada et al.

(10) Patent No.: US 10,529,605 B2
(45) Date of Patent: Jan. 7, 2020

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Takayuki Nakada, Toyama (JP); Daigi Kamimura, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/136,644

(22) Filed: Sep. 20, 2018

(65) Prior Publication Data

US 2019/0019705 A1  Jan. 17, 2019

Related U.S. Application Data

(63) Continuation of application No. PCT/JP2016/059416, filed on Mar. 24, 2016.

(51) Int. Cl.
*H01L 21/673* (2006.01)
*H01L 21/67* (2006.01)
(Continued)

(52) U.S. Cl.
CPC .... *H01L 21/67393* (2013.01); *C23C 16/4582* (2013.01); *C23C 16/4583* (2013.01);
(Continued)

(58) Field of Classification Search
CPC ......... H01L 21/67393; H01L 21/67248; H01L 21/67103; H01L 21/67253;
(Continued)

(56) References Cited

U.S. PATENT DOCUMENTS 5,261,167 A   11/1993  Sakata
5,407,350 A *  4/1995  Iwabuchi ................ C23C 16/54
                                                                432/11
(Continued)

FOREIGN PATENT DOCUMENTS

JP   2002-175999 A   6/2002
JP   2002-176045 A   6/2002
(Continued)

OTHER PUBLICATIONS

International Search Report dated Jun. 21, 2016 for PCT International Application No. PCT/JP2016/059416.
Office Action dated Apr. 5, 2019 for U.S. Appl. No. 15/422,018.

*Primary Examiner* — Jeffrie R Lund
(74) *Attorney, Agent, or Firm* — Volpe and Koenig, P.C.

(57) ABSTRACT

There is provided a technique includes: a substrate holder including a heat insulating part and a substrate holding part disposed above the heat insulating part and holding substrates in multiple stages; a process chamber processing the substrates held by the substrate holding part; a transfer chamber adjacent to the process chamber and transferring the substrates to the substrate holding part; a transfer mechanism transferring the substrate holder; a first gas supply part installed on one side of the transfer chamber and supplying gas into the transfer chamber; a second gas supply part having gas outlets at a height position between the substrate held at a lowermost stage of the substrate holding part and the heat insulating part and supplying a gas toward the substrate holder; and a controller controlling the transfer mechanism, the first gas supply part and the second gas supply part.

18 Claims, 8 Drawing Sheets

(51) Int. Cl.
*C23C 16/458* (2006.01)
*C23C 16/455* (2006.01)
*C23C 16/46* (2006.01)
*H01L 21/677* (2006.01)

(52) U.S. Cl.
CPC ...... *C23C 16/45578* (2013.01); *C23C 16/463* (2013.01); *H01L 21/67017* (2013.01); *H01L 21/67028* (2013.01); *H01L 21/67103* (2013.01); *H01L 21/67109* (2013.01); *H01L 21/67248* (2013.01); *H01L 21/67253* (2013.01); *H01L 21/67757* (2013.01); *H01L 21/67781* (2013.01)

(58) Field of Classification Search
CPC ......... H01L 21/67781; H01L 21/67757; H01L 21/67109; H01L 21/67017; H01L 21/67028; C23C 16/45578; C23C 16/458; C23C 16/4582; C23C 16/4583; C23C 16/463
See application file for complete search history.

(56) References Cited

U.S. PATENT DOCUMENTS

| | | | | |
|---|---|---|---|---|
| 5,514,196 | A * | 5/1996 | Tanahashi | F24F 3/16 55/324 |
| 5,551,984 | A * | 9/1996 | Tanahashi | C23C 16/4401 118/715 |
| 6,036,781 | A * | 3/2000 | Ahn | C23C 16/0227 118/715 |
| 9,230,843 | B2 * | 1/2016 | Toba | H01L 21/67757 |
| 10,131,984 | B2 | 11/2018 | Okada | |
| 10,340,164 | B2 * | 7/2019 | Watanabe | H01L 21/67781 |
| 2002/0023458 | A1 | 2/2002 | Sakata et al. | |
| 2008/0105204 | A1 * | 5/2008 | Nakada | H01L 21/67109 118/728 |
| 2008/0134977 | A1 * | 6/2008 | Nakashima | C23C 16/4408 118/729 |
| 2009/0044749 | A1 * | 2/2009 | Ozaki | H01L 21/67017 118/698 |
| 2010/0229416 | A1 * | 9/2010 | Aburatani | H01L 21/67109 34/194 |
| 2011/0305543 | A1 | 12/2011 | Nakashima et al. | |
| 2012/0269603 | A1 * | 10/2012 | Toba | H01L 21/67109 414/160 |
| 2012/0270170 | A1 | 10/2012 | Nitadori | |
| 2013/0062035 | A1 * | 3/2013 | Kawakami | H01L 21/67109 165/59 |
| 2017/0218513 | A1 * | 8/2017 | Nakada | C23C 16/402 |
| 2017/0292188 | A1 * | 10/2017 | Nakada | H01L 21/205 |
| 2019/0019705 | A1 * | 1/2019 | Nakada | H01L 21/67109 |

FOREIGN PATENT DOCUMENTS

| | | |
|---|---|---|
| JP | 2005-197373 A | 7/2005 |
| JP | 2008-172080 A | 7/2008 |
| JP | 2012-169367 A | 9/2012 |
| JP | 2013-129869 A | 7/2013 |
| JP | 2015-002339 A | 1/2015 |
| JP | 2015-031428 A | 2/2015 |
| WO | 2016/117588 A1 | 7/2016 |

\* cited by examiner

76

76

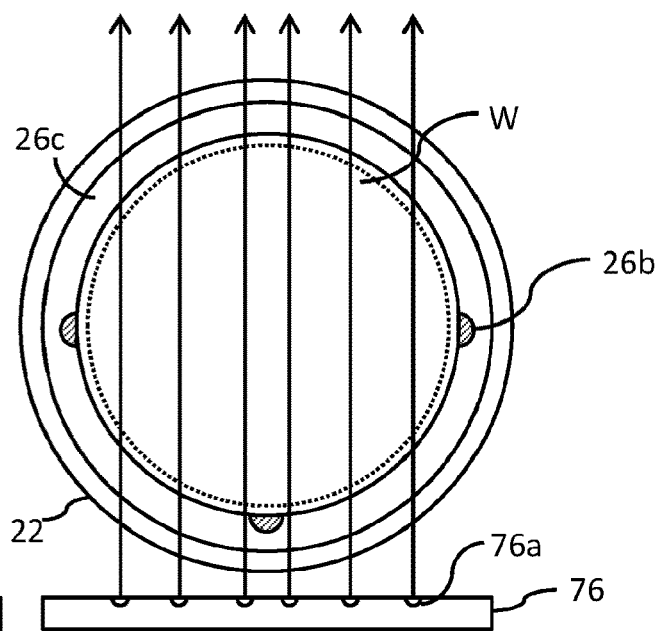

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2016/059416, filed on Mar. 24, 2016, the entire contents of which are incorporated herein by reference.

TECHNICAL FIELD

The present disclosure relates to a substrate processing apparatus, a method of manufacturing a semiconductor device, and a recording medium.

BACKGROUND

Generally, in the related art, a vertical substrate processing apparatus used in a process of manufacturing a semiconductor device includes a process chamber in which a substrate is processed, and a transfer chamber disposed adjacent to the process chamber. The substrate processed in the process chamber is cooled to a predetermined temperature in the transfer chamber. A clean unit is installed in the transfer chamber and a gas is supplied from the clean unit into the transfer chamber.

However, the above conventional configuration of the transfer chamber may take time to cool the substrate.

The present disclosure provides some embodiments of a technique capable of shortening a time to cool a substrate.

SUMMARY

According to one embodiment of the present disclosure, there is provided a technique including: a substrate holder including a heat insulating part and a substrate holding part disposed above the heat insulating part and holding a plurality of substrates in multiple stages; a process chamber configured to process the plurality of substrates held by the substrate holding part; a transfer chamber adjacent to the process chamber and configured to transfer the plurality of substrates to the substrate holding part; a transfer mechanism configured to transfer the substrate holder; a first gas supply part installed on one side of the transfer chamber and configured to supply a gas into the transfer chamber; a second gas supply part having gas outlets at a height position between one of the plurality of substrates held at a lowermost stage of the substrate holding part and the heat insulating part and configured to supply a gas toward the substrate holder; and a controller configured to control the transfer mechanism, the first gas supply part and the second gas supply part.

BRIEF DESCRIPTION OF DRAWINGS

FIG. 5C is a view illustrating a modification of the gas supply part, and FIG. 5D is a view illustrating a modification of the gas supply part.

DETAILED DESCRIPTION

Figure 1:
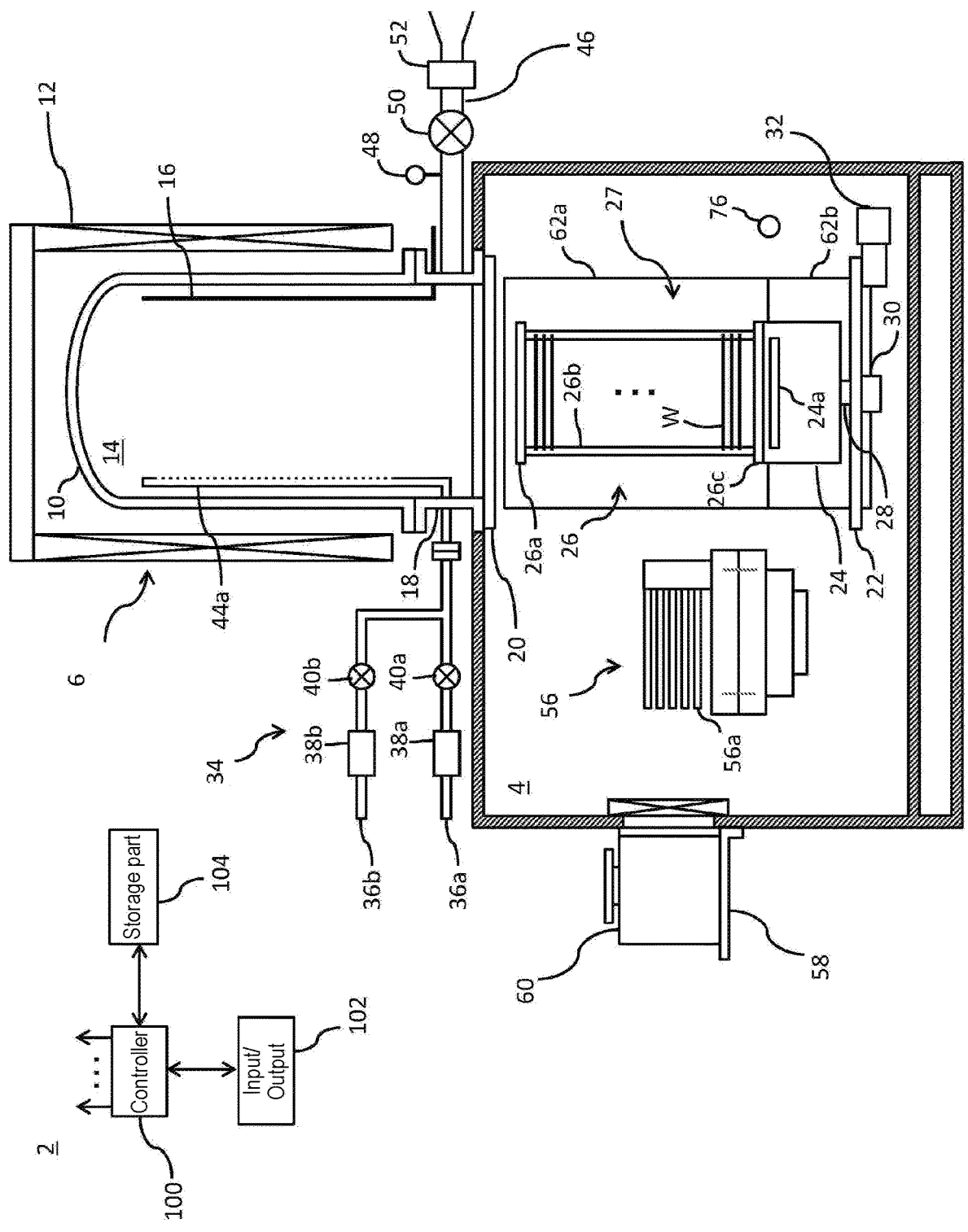
FIG. 1 is a longitudinal sectional view illustrating a schematic configuration example of a substrate processing apparatus suitably used in one embodiment of the present disclosure.

A non-limiting exemplary embodiment of the present disclosure will now be described with reference to the drawings. Throughout the drawings, the same or corresponding configurations are denoted by the same or corresponding reference numerals, and explanation thereof will not be repeated.

In the present embodiment, a substrate processing apparatus is configured as a vertical substrate processing apparatus (hereinafter referred to as a processing apparatus) 2 that performs a substrate processing process such as heat treatment, which is one manufacturing process in a method of manufacturing a semiconductor device. As illustrated in FIG. 1, the processing apparatus 2 includes a transfer chamber 4 and a processing furnace 6 disposed above the transfer chamber 4.

The processing furnace 6 includes a cylindrical reaction tube 10 and a heater 12 which is a first heating part (heating mechanism) installed on the circumference of the reaction tube 10. The reaction tube 10 is made of, e.g., quartz or SiC. A process chamber 14 for processing a wafer W as a substrate is formed inside the reaction tube 10. A temperature detecting part 16 as a temperature detector is installed in the reaction tube 10. The temperature detecting part 16 is erected along the inner wall of the reaction tube 10.

A cylindrical manifold 18 is connected to the lower end opening of the reaction tube 10 via a seal member such as an O ring and supports the lower end of the reaction tube 10. The manifold 18 is made of, e.g., metal such as stainless steel. The lower end opening of the manifold 18 is opened and closed by a disc-shaped shutter 20 or lid 22. The lid 22 is made of, e.g., metal in a disc shape. A seal member such as an O ring is installed on the upper surfaces of the shutter 20 and the lid 22, thereby hermetically sealing an interior of the reaction tube 10 from an outside air.

A heat insulating part 24 is placed on the lid 22. The heat insulating part 24 is made of, e.g., quartz. The heat insulating part 24 has a cap heater 24a, which is a second heating part (heating mechanism), installed on the surface thereof or inside thereof. The cap heater 24a is configured to heat substrates held below the process chamber 14 and the lower portion of a boat 26 to be described later. The boat 26 serves as a substrate holding part and is installed above the heat insulating part 24. The boat 26 includes a top plate 26a, a bottom plate 26c and a plurality of columns 26b disposed between the top plate 26a and the bottom plate 26c. The boat 26 supports a plurality of wafers W, for example, 25 to 150 wafers W, vertically in multiple stages by placing the wafers W in grooves formed in multiple stages on columns 26b. The boat 26 is made of, e.g., quartz or SiC. The heat insulating part 24 and the boat 26 constitute a substrate holder 27. During substrate processing, the substrate holder 27 is accommodated in the process chamber 14.

The heat insulating part 24 is connected to a rotary shaft 28 penetrating the lid 22. The rotary shaft 28 is connected to a rotation mechanism 30 installed below the lid 22. By rotating the rotary shaft 28 by the rotation mechanism 30, the heat insulating part 24 and the boat 26 can be rotated.

A substrate transfer device 56, the boat 26, and a boat elevator 32 as an elevating mechanism are arranged inside the transfer chamber 4. The substrate transfer device 56 has, for example, an arm (tweezer) 56a which can take out, e.g., five wafers W. The substrate transfer device 56 is configured to transfer the wafers W between a pod 60 placed at the position of a pod opener 58 and the boat 26 by vertically rotating the arm 56a by a driving part (not shown). The boat elevator 32 loads/unloads the boat 26 in/from the reaction tube 10 by raising and lowering the lid 22. The detailed configuration of the transfer chamber 4 will be described later.

The processing apparatus 2 includes a gas supply mechanism 34 for supplying a gas to be used for substrate processing into the process chamber 14. The gas supplied by the gas supply mechanism 34 is appropriately changed according to the type of a film to be formed. The gas supply mechanism 34 includes a precursor gas supply part (precursor gas supply system), a reaction gas supply part (reaction gas supply system) and an inert gas supply part (inert gas supply system).

The precursor gas supply system includes a gas supply pipe 36a in which a mass flow controller (MFC) 38a, which is a flow rate controller (flow rate control part), and a valve 40a which is an opening/closing valve, are installed in order from the upstream side. The gas supply pipe 36a is connected to a nozzle 44a passing through the side wall of the manifold 18. The nozzle 44a stands upright along the vertical direction within the reaction tube 10 and has a plurality of supply holes that are opened toward the wafers W held by the boat 26. A precursor gas is supplied to the wafers W through the supply holes of the nozzle 44a.

With the same configuration, a reaction gas is supplied to the wafers W from the reaction gas supply system via the supply pipe 36a, the MFC 38a, the valve 40a and the nozzle 44a. An inert gas is supplied to the wafers W from the inert gas supply system via a supply pipe 36b, an MFC 38b, a valve 40b and the nozzle 44a.

An exhaust pipe 46 is attached to the manifold 18. The exhaust pipe 46 is connected to a vacuum pump 52, which is a vacuum exhaust device, via a pressure sensor 48, which is a pressure detector (pressure detecting part), for detecting the internal pressure of the process chamber 14, and an APC (Auto Pressure Controller) valve 40, which is a pressure regulator (pressure adjusting part). With such a configuration, it is possible to set the internal pressure of the process chamber 14 to a processing pressure according to the processing.

Next, the configuration of the transfer chamber 4 according to the present embodiment will be described with reference to FIGS. 1 to 3.

Figure 2:
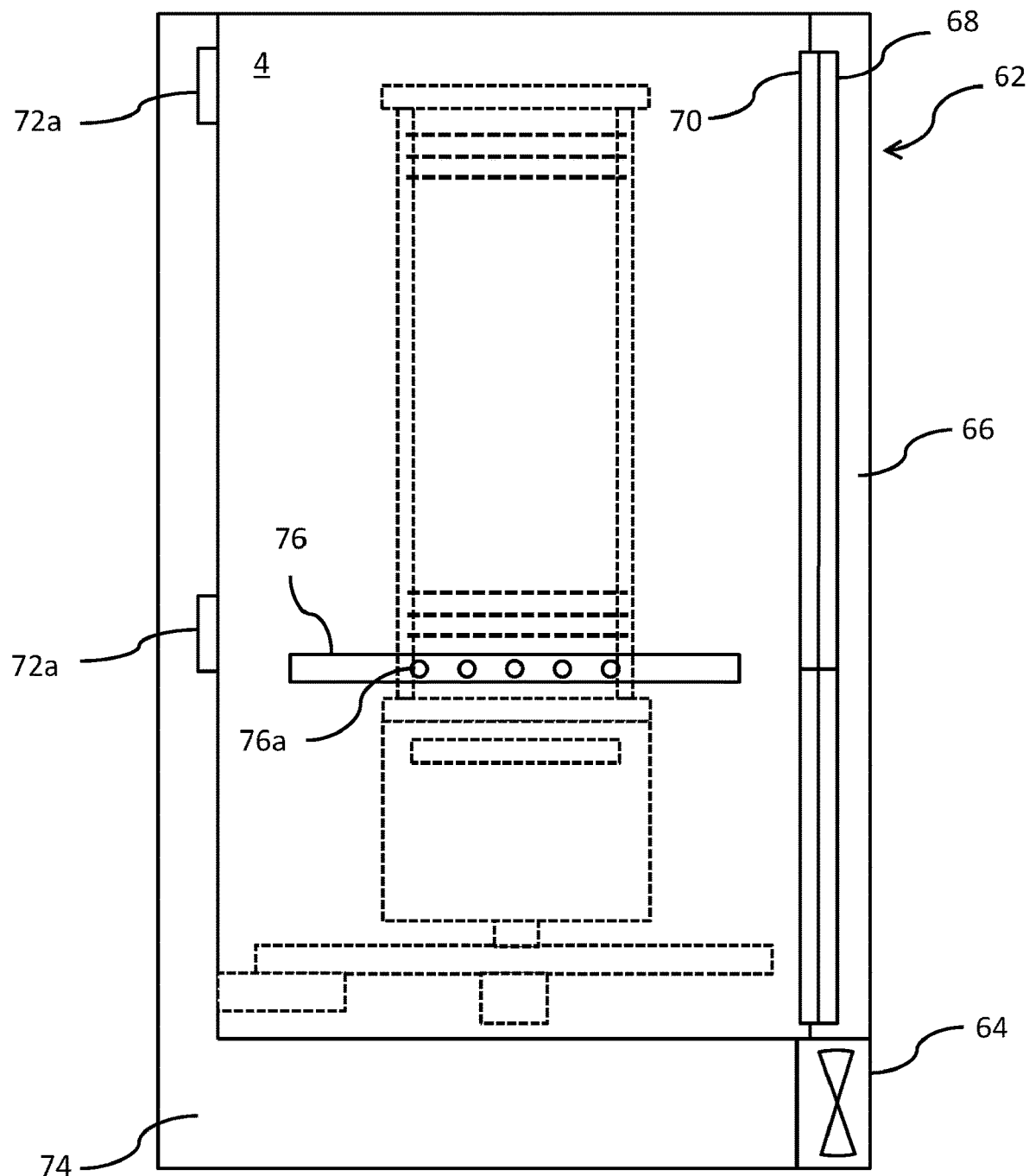
FIG. 2 is a longitudinal sectional view illustrating a schematic configuration example of a transfer chamber according to one embodiment of the present disclosure.
Figure 3:
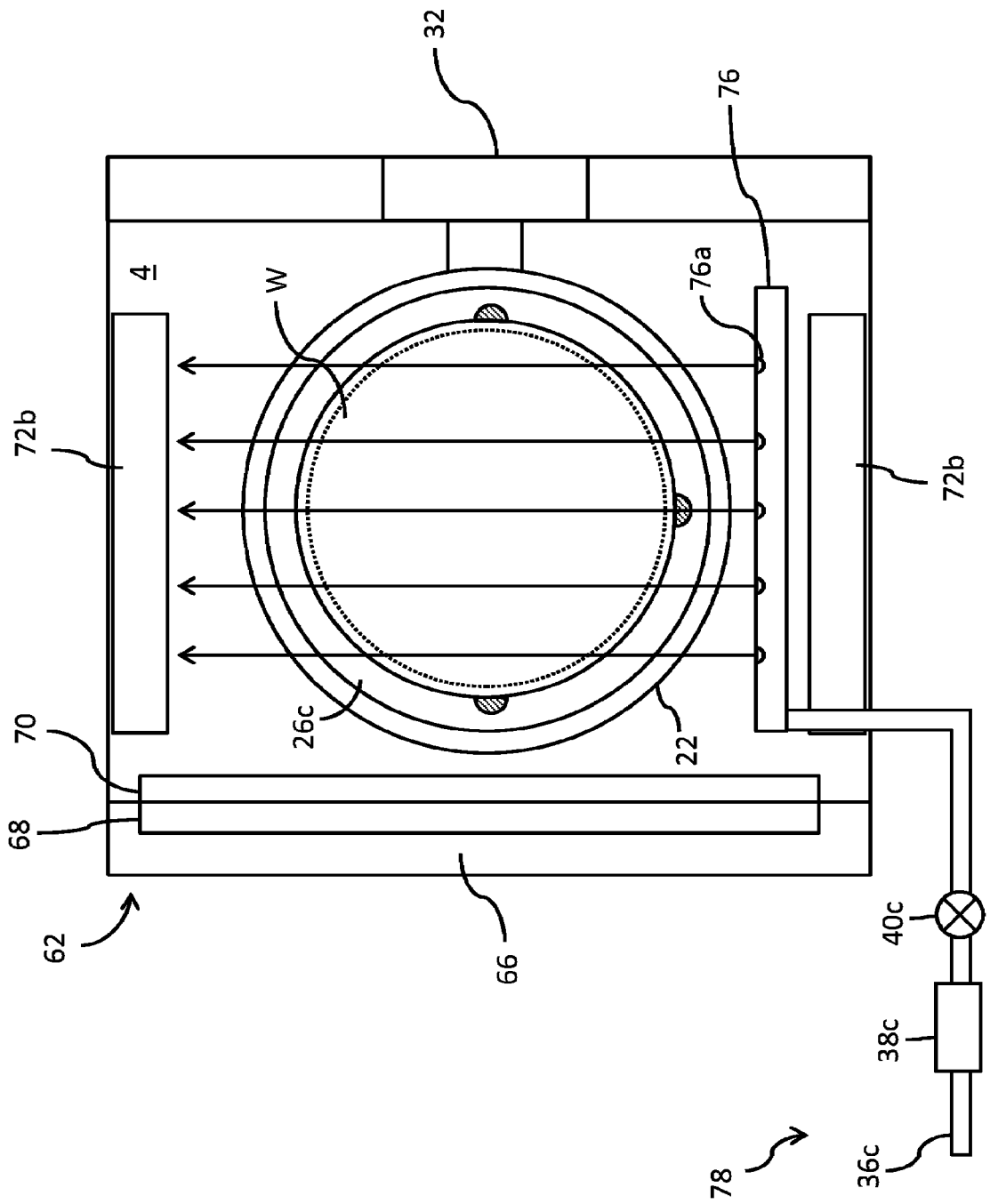
FIG. 3 is a cross-sectional view illustrating a schematic configuration example of a transfer chamber according to one embodiment of the present disclosure.

As illustrated in FIGS. 2 and 3, the transfer chamber 4 is formed in a flat polygonal shape by a ceiling, a floor and side walls surrounding the four sides, for example, in a planar quadrilateral shape. A clean unit 62, which is a first blower (first gas supply part), is installed on one side of the transfer chamber 4. A gas as clean air (clean atmosphere) is supplied by the clean unit 62 into the transfer chamber 4. In addition, a circulation path 74 for circulating a gas is formed in a space located around the transfer chamber 4. The gas supplied into the transfer chamber 4 is exhausted from an exhaust part 72 and is again supplied by the clean unit 62 into the transfer chamber 4 via the circulation path 74. A radiator (not shown) is installed in the middle of the circulation path 74 and the gas is cooled by passing through the radiator.

The clean unit 62 includes an upper clean unit 62a and a lower clean unit 62b arranged vertically adjacent to each other. The upper clean unit 62a is configured to supply a gas into the transfer chamber 4, in particular, toward the boat 26. The lower clean unit 62b is configured to supply a gas into the transfer chamber 4, in particular, toward the heat insulating part 24. Hereinafter, when the clean unit 62 is referred to, it includes a case of indicating the clean unit 62a, a case of indicating the clean unit 62b, or both.

The clean unit 62 has a fan 64, which is an air blowing part, a buffer area 66, which is a buffer chamber, a filter part 68 and a gas supply port 70 in order from the upstream side. The buffer area 66 is a diffusion space for uniformly blowing out a gas from the entire surface of the gas supply port 70. The filter part 68 is configured to remove particles contained in the gas. The fan, the buffer area, the filter part and the gas supply port are provided at the clean units 62a and 62b, respectively.

A side exhaust part 72a and the boat elevator 32 are installed on one of the facing sides of the clean unit 62. A gas supplied from the clean unit 62a into the transfer chamber 4 is mainly discharged by the side exhaust part 72a and is again supplied by the clean unit 62 into the transfer chamber 4 via the circulation path 74. As a result, a gas flow (side flow) in the horizontal direction (direction parallel to the wafers W) is formed in the upper region (wafer W region) in the transfer chamber 4.

As illustrated in FIG. 3, a pair of bottom exhaust parts 72b is installed on the floor surface of the transfer chamber 4 with the boat 26 therebetween. The bottom exhaust parts 72b are each formed in a rectangular shape along one side of the transfer chamber 4. The gas supplied from the clean unit 62b into the transfer chamber 4 is mainly discharged by the bottom surface exhaust parts 72b and is again supplied by the clean unit 62 into the transfer chamber 4 via the circulation path 74. As a result, a gas flow (down flow) it the vertical direction is formed in the lower region (heat insulating part 24 region) in the transfer chamber 4.

As illustrated in FIGS. 1 and 3, a gas pipe 76, which is a second blower (second gas supply part), is installed on a side face other than the side faces that face the side surface on which the clean unit 62 is installed. For example, the gas pipe 76 is installed on the side surface adjacent to the side surface on which the clean unit 62 is installed. In this embodiment, the gas pipe 76 is installed at a position where the gas pipe 76 faces the transfer device 56 in the transfer chamber 4 with the boat 26 interposed therebetween (position between the side surface of the transfer chamber 4 and the boat 26). The gas pipe 76 is configured to supply a gas toward a region below a substrate placed on the bottom of the boat 26. In some embodiments, the gas pipe 76 may be configured to supply a gas toward a region between the lowermost substrate of the boat 26 and the heat insulating part 24.

As illustrated in FIG. 2, the gas pipe 76 is horizontally installed along the horizontal direction in the transfer chamber 4 and has gas outlets 76a opened toward the substrate holder 27. A gas is supplied into the transfer chamber 4, particularly to the substrate holder 27, via the gas outlets 76a of the gas pipe 76. An example of the gas may include an inert gas. The gas pipe 76 is connected to a transfer chamber gas supply mechanism 78 for supplying a gas into the transfer chamber 4. The transfer chamber gas supply mechanism 78 includes a gas supply pipe 36c in which an MFC 38c and a valve 40c are installed in order from the upstream side.

The gas pipe 76 is installed such that the height position of the gas outlets 76a lies between the substrate held at the lowermost stage of the boat 26 and the heat insulating part 24. As illustrated in FIG. 3, the gas outlets 76a are formed by a plurality of openings. In a case where the gas outlets 76a are formed by an even number of openings, the same number of openings are formed on the left and right sides of the center line of the wafer W. In a case where the gas outlets 76a are formed by an odd number of openings, one opening is formed on the center line of the wafer W and the same number of openings are formed on the left and right sides of the one opening. In the present embodiment, the gas outlets 76a are formed by, for example, five openings having a diameter of 1 mm or less. In plan view, the gas outlets 76a are formed in a region within a range of the diameter of the wafer W. In other words, the opening (forming) range of the gas outlets 76a is formed so as to fall within the range of the diameter of the wafer W. With such a configuration, the main flow direction of a gas supplied from the gas outlets 76a can be in the horizontal direction. As a result, a gas barrier (gas curtain) can be formed in a space between the lowermost substrate of the boat 26 and the heat insulating part 24, and the upper atmosphere on the side of the boat 26 (the atmosphere of the wafer W region) and the lower atmosphere on the side of the heat insulation part 24 (the atmosphere of the heat insulating part 24 region) can be separated by the gas curtain.

As illustrated in FIG. 1, the rotation mechanism 30, the boat elevator 32, the transfer device 56, the gas supply mechanism 34 (the MFCs 38a to 38d and the valves 40a to 40d), the APC valve 50, the clean unit 62 and the transfer chamber gas supply mechanism 78 (the MFC 38e and the valve 40e) are connected with a controller 100 for controlling them. The controller 100 includes, for example, a microprocessor (computer) including a CPU and is configured to control the operation of the processing apparatus 2. An input/output device 102 configured as a touch panel or the like is connected to the controller 100.

A storage part 104 as a storage medium is connected to the controller 100. In the storage part 104 are readably stored a control program for controlling the operation of the processing apparatus 2 and programs (recipes such as a process recipe and a cleaning recipe) for causing each part of the processing apparatus 2 to execute a process in accordance with processing conditions.

The storage part 104 may be a storage device (a hard disk or a flash memory) incorporated in the controller 100 or may be an external recording device (a magnetic tape, a magnetic disk such as a flexible disk or a hard disk, an optical disk such as a CD or a DVD, an magneto-optical disk such as a MO, or a semiconductor memory such as a USB memory or a memory card). In addition, the programs may be provided to the computer by using communication means such as the Internet or a dedicated line. As necessary, the programs are read out from the storage part 104 according to an instruction from the input/output device 102 or the like and the controller 100 executes a process according to the read recipes, so that the processing apparatus 2 can perform a desired process under control of the controller 100.

Next, a process of forming a film on a substrate using the above-described processing apparatus 2 (a film-forming process) will be described. Here, an example of forming a silicon oxide ($SiO_2$) film on a wafer W by supplying a DCS ($SiH_2Cl_2$: dichlorosilane) gas as a precursor gas and an $O_2$ (oxygen) gas as a reaction gas to the wafer W will be described. In the following description, the operation of each part constituting the processing apparatus 2 is controlled by the controller 100.

(Transfer Step)

Figure 4A:
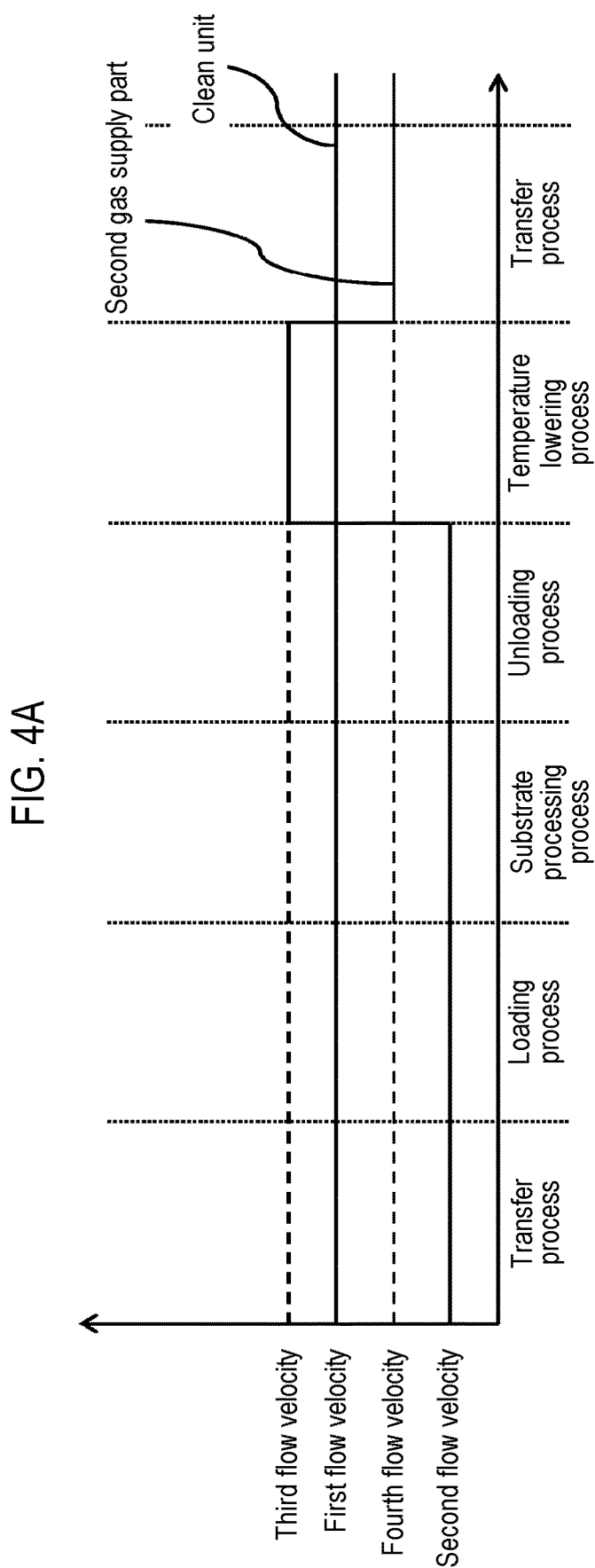
FIG. 4A is a view illustrating flow velocities of gases supplied from a clean unit and a second gas supply part and FIG. 4B is a view illustrating flow rates of the gases supplied from the clean unit and the second gas supply part.
Figure 4B:
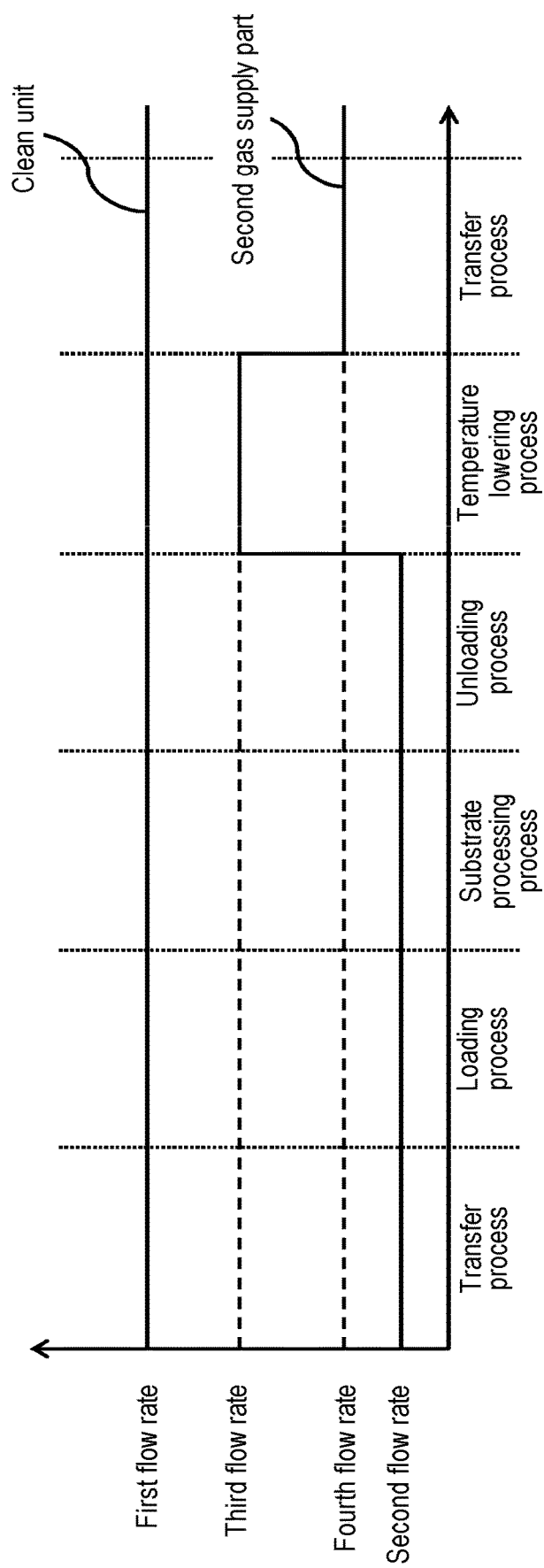

The transfer device 56 transfers the wafer W from the pod 60 to the boat 26 (wafer charge). At this time, as illustrated in FIGS. 4A and 4B, a gas is supplied into the transfer chamber 50 from the clean unit 62 and the gas pipe 76. The gas is supplied from the clean unit 62 into the transfer chamber 4 at a first flow velocity or a first flow rate and from the gas pipe 76 into the transfer chamber 4 at a second flow velocity lower than the first flow velocity and a second flow rate lower than the first flow rate.

The first flow velocity is, for example, 10 to 20 cm/s and the first flow rate is, for example, 6,500 to 13,000 L/min. When the first flow velocity is lower than 10 cm/s or when the first flow rate is lower than 6,500 L/min, it takes time to cool the wafer W or it becomes difficult to keep the interior of the transfer chamber 4 clean. When the first flow velocity is higher than 20 cm/s or when the first flow rate is higher than 13,000 L/min, the wafer W vibrates or rolls up particles.

The second flow velocity is, for example, 0 to 5 cm/s and the second flow rate is, for example, 0 to 3 L/min. When the second flow velocity is higher than 5 cm/s or when the second flow rate is higher than 3 L/min, the wafer W rolls up.

(Loading Step)

Next, the shutter 20 closing a wafer loading/unloading port in the lower portion of the process chamber 14 is retreated to a shutter storage part (not shown) to open the wafer loading/unloading port of the process chamber 14. Subsequently, the lid 22 is raised by the boat elevator 32 and the substrate holder 27 is loaded into the process chamber 14 from the transfer chamber 4 (boat loading). Thereby, the lid 22 seals the lower end of the manifold 18 via a sealing member. At this time, the supply of gas from the clean unit 62 and the gas pipe 76 into the transfer chamber 4 is continued under the same condition as the transfer step.

(Substrate Processing Step)

When the substrate holder 27 is loaded into the process chamber 14, the interior of the process chamber 14 is exhausted by the exhaust pipe 46 to set the internal pressure of the process chamber 14 to a desired pressure (degree of vacuum). In addition, the interior of the process chamber 14 is heated by the heater 12 and the boat 26 is rotated by operating the rotation mechanism 30. Further, a DCS gas and an $O_2$ gas are supplied into the process chamber 14 by the gas supply mechanism 34. As a result, a $SiO_2$ film is formed on the surface of the wafer W. When a $SiO_2$ film having a desired film thickness is formed on the surface of the wafer W, the gas supply mechanism 34 stops the supply of DCS gas and $O_2$ gas into the process chamber 14 and supplies an inert gas into the process chamber 14. As a result, the interior of the process chamber 14 is substituted with the inert gas and the internal pressure of the process chamber 14 is restored to the normal pressure. At this time, in the transfer chamber 4, the supply of gas from the clean unit 62 and the gas pipe 76 into the transfer chamber 4 is continued under the same conditions as in the transfer step. In the substrate processing step, the supply of gas from the gas pipe 76 may be stopped.

(Unloading Step)

Upon completion of the substrate processing step, the lid 22 is lowered by the boat elevator 32 to open the lower end of the manifold 18, and the substrate holder 27 is unloaded from the process chamber 14 into the transfer chamber 4 (boat unloading). Thereafter, the wafer loading/unloading port of the process chamber 14 is closed by the shutter 20. At this time, the supply of gas from the clean unit 62 and the gas pipe 76 into the transfer chamber 4 is continued under the same condition as the transfer step.

(Temperature Lowering Step)

Upon completion of the unloading of the substrate holder 27 to the transfer chamber 4, the wafer W is lowered in terms of temperature (i.e., cooled) in the transfer chamber 4 until the wafer W reaches a predetermined temperature. At this time, the supply of gas is continued from the clean unit 62 at the first flow velocity and the first flow rate, and the gas is supplied from the gas pipe 76 to the substrate holder 27 at a third flow rate higher than first flow velocity and a third flow rate lower than the first flow rate and higher than the second flow rate. Here, the predetermined temperature is a temperature at which the wafer W can be unloaded and is a temperature equal to or lower than the heat resistant temperature of the tweezer 56a or the pod 60.

The third flow velocity is, for example, 20 to 40 cm/s and the third flow rate is, for example, 15 to 70 L/min. When the third flow velocity is lower than 20 cm/s or when the third flow rate is lower than 15 L/min, a horizontal gas flow cannot be formed in the region between the lowermost wafer W of the boat 26 and the heat insulating part 24. When the third flow velocity is higher than 40 cm/s or when the third flow rate is higher than 70 L/min, the wafer W vibrates.

(Transfer Step)

When the temperature of the wafer W is lowered to the predetermined temperature, the transfer device 56 transfers the wafer W from the boat 26 to the pod 60 (wafer discharge). At this time, the supply of gas is continued from the clean unit 62 at the first flow velocity or the first flow rate and the gas is supplied from the gas pipe 76 to the substrate holder 27 at a fourth flow velocity lower than the first flow velocity or a fourth flow rate lower than the third flow rate.

The fourth flow velocity is, for example, 5 to 20 cm/s and the fourth flow rate is, for example, 3 to 15 L/min. When the fourth flow velocity is lower than 5 cm/s or when the fourth flow rate is lower than 3 L/min, a sufficient gas flow cannot be formed in the region between the lowermost wafer W of the boat 26 and the heat insulating part 24. When the fourth flow velocity is higher than 20 cm/s or when the fourth flow rate is higher than 15 L/min, the wafer W vibrates or rolls up particles.

(3) Effects According to the Present Embodiment

According to the present embodiment, one or more effects set forth below may be achieved.

(a) By supplying a gas to a region between the lowermost substrate of the boat and the heat insulating part to form a gas curtain, it is possible to shorten the cooling time of the substrate.

Generally, the substrate is more easily cooled than the heat insulating part. Therefore, in the transfer chamber after the substrate processing, since the temperature of the atmosphere around the substrate (around the boat) is lower than the temperature of the atmosphere around the heat insulating part, an ascending air current going upward from the heat insulating part toward the boat may occur. The substrate may be heated by the heat contained in the ascending air current from the heat insulating part, which may take time to cool the substrate. In particular, a lower substrate of the boat is more susceptible to the heat from the heat insulating part and may not be sufficiently cooled even when an upper substrate of the boat is cooled to a temperature at which the substrate can be transferred. That is, in order to cool the lower substrate of the boat, it is necessary to cool the heat insulating part to some extent, which prolongs the cooling time of the substrate.

In contrast, according to the present embodiment, by supplying a gas to the region between the lowermost substrate of the boat and the heat insulating part, the ascending air current from the heat insulating part can be swept horizontally, thereby preventing the substrate from being exposed to a high temperature atmosphere from the heat insulating part. That is, since the gas curtain is formed between the lowermost substrate of the boat and the heat insulating part, the heat from the heat insulating part can be interrupted. As a result, even when the heat insulating part is not cooled, since the substrate can be cooled without being affected by the heat from the heat insulating part, the cooling time of the substrate can be shortened.

(b) By changing the flow rate of a gas supplied from the gas pipe according to the processing step, a yield can be improved.

Even when the gas is supplied from the gas pipe to the substrate holder under transfer, since the gas is temporarily supplied to the heat insulating part, it is considered that the substrate cooling effect is not so high. In addition, supplying the gas to the heat insulating part may cause particles to be rolled up.

In contrast, according to the present embodiment, by stopping the supply of gas from the gas pipe during transfer of the substrate holder or supplying the gas supply at a small flow rate, it is possible to prevent particles from being generated from the heat insulating part, thereby improving a yield.

(c) By making the gas outlets a plurality of openings, the cooling efficiency of the substrate can be improved.

It has been confirmed that it is effective to secure the flow velocity of gas between the lowermost substrate of the boat and the heat insulating part in order to shield the ascending air current from the heat insulating part. By making the gas outlets a plurality of openings, the internal pressure of the gas supply part can be increased and the flow velocity can be increased. As a result, since the ascending air current from the heat insulating part can be prevented from reaching the substrate, the cooling efficiency of the substrate can be improved.

(d) By setting the opening area of the gas outlets to fall within the range of the diameter of the wafer, the cooling efficiency of the substrate can be improved.

By setting the opening area of the gas outlets to fall within the range of the diameter of the wafer, since it is possible to form the gas curtain at least within the range of the diameter of the wafer, it is possible to suppress the influence of heat from the heat insulating part to the wafer. Further, by forming the gas curtain within the range of the diameter of the wafer, it becomes easier to form the main flow of the gas at the central portion of the wafer (central portion of the heat insulating part in plan view). As a result, it is possible to more effectively block the heat from the central portion (the portion heated by the cap heater) which is difficult to dissipate heat, thereby improving the cooling efficiency of the substrate.

(e) By installing the gas pipe at a position other than the facing position of the clean unit, the flow of gas inside the transfer chamber can be smoothed.

When the gas pipe is installed at the facing position of the clean unit, since the gas flow from the gas pipe and the gas flow from the clean unit face each other, the air flow in the transfer chamber may be disturbed, which may cause stagnation or convection current in the transfer chamber.

In contrast, according to the present embodiment, since the gas flow from the gas pipe does not face the gas flow from the clean unit, it can be smoothly merged with the gas flow from the clean unit (gas flow between the lowermost substrate of the boat and the heat insulating part from the clean unit) and disturbance of the air flow in the transfer chamber can be suppressed. In addition, since there is little interference with the gas flow from the clean unit, it is possible to promote forming the gas curtain between the substrate and the heat insulating part.

(f) By setting the wafer region as a side flow and the heat insulating part region as a down flow, it is easy to form the gas curtain in the region between the substrate and the heat insulating part.

The region between the lowermost substrate of the boat and the heat insulation part is a boundary region between the side flow and the down flow. Therefore, the gas supplied from the gas pipe does not strongly interfere with only one of the gas flows and the gas curtain can be formed as a third gas flow independent of the side flow in the wafer region and the down flow in the heat insulating part region.

The present embodiment is not limited to the above-described aspects but can be altered as the following modifications.
(Modification 1)

For example, in the temperature lowering process described above, the substrate holder 27 may be rotated. As a result, since a gas can be supplied from the entire circumferential direction of the substrate holder 27, the substrate cooling efficiency can be further improved, thereby improving a throughput.
(Modification 2)

For example, the gas supply part 76 may be installed at a corner in the transfer chamber 4. Alternatively, it may be installed on a side surface where the clean unit 62 is installed. In this case, the gas supply part may be installed at a height position between the clean unit 62a and the clean unit 62b. As a result, the gas flow in the transfer chamber 4 can be made smoother, thereby improving the productivity.
(Modification 3)

Figure 5A:
FIG. 5A is a view illustrating a modification of a gas supply part.
Figure 5B:
FIG. 5B is a view illustrating a modification of the gas supply part.

For example, the gas outlets 76a may be formed in a horizontally long slit shape. In addition, as illustrated in FIG. 5A, the gas outlets 76a may be formed by a plurality of slits. Further, as illustrated in FIG. 5B, the gas outlets 76a may be formed by combination of slit-shaped openings and circular openings. Further, as illustrated in FIG. 5C, the gas outlets 76a may be formed by a plurality of openings alternating in the height direction. Further, as illustrated in FIG. 5D, the gas outlets 76a may be formed so as to avoid the boat columns 26b. The width and length of the slits and the size of the openings are appropriately set so as to ensure a predetermined flow velocity. With these configurations, it is possible to suppress stagnation of gas flow in the region between the lowermost wafer W of the boat 26 and the heat insulating part 24, which makes it easier to form the gas curtain.
(Modification 4)

Figure 6:
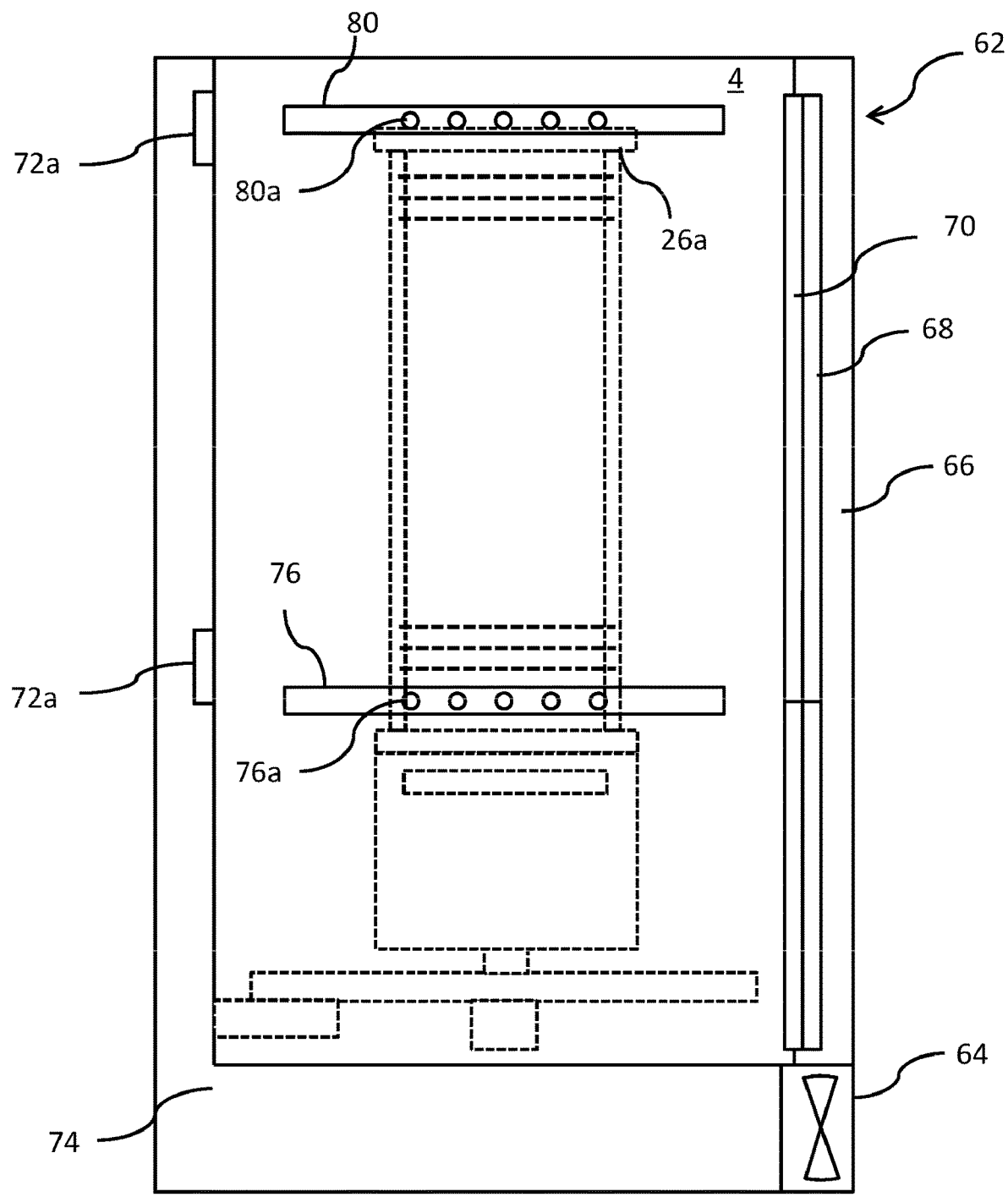
FIG. 6 is a longitudinal sectional view illustrating a schematic configuration example of a transfer chamber in Modification 4.

As illustrated in FIG. 6, a gas pipe 80 as a third blower (third gas supply part) may be installed above the gas pipe 76. The gas pipe 80 is installed so that the height position of gas outlets 80a is equal to or greater than the height position of the top plate 26a of the boat 26. In some embodiments, the height position of the gas outlets 80a is set to be substantially flush with the top surface of the top plate 26a. The gas pipe 80 has the same shape as the gas pipe 76. The gas pipe 80 is connected to the transfer chamber gas supply mechanism 78 and supplies a gas into the transfer chamber 4, particularly the top plate 26a of the boat 26, with the same configuration as the gas pipe 76. The gas flow rate and gas flow velocity supplied from the gas pipe 80 may be set to be equal to or lower than the gas flow rate and gas flow velocity supplied from the gas pipe 76. Since the boat 26 is more easily cooled (has a smaller heat capacity) than the heat insulating part 24, the boat 26 can be effectively cooled even at a gas flow rate and a gas flow velocity lower than the gas flow rate and the gas flow velocity supplied from the gas pipe 76. With such a configuration, it is possible to cool the atmosphere around the boat, thereby improving the productivity.

It has been illustrated in the above embodiment that a film is deposited on the water W, but the present disclosure is not limited to such an embodiment. For example, the present disclosure can also be suitably applied to a case where a process such as an oxidizing process, a diffusing process, an annealing process, an etching process or the like is performed on a wafer W, a film formed on the water W, or the like.

In addition, the embodiment and modifications described above can be used in appropriate combination. The processing conditions at this time can be the same as the processing conditions of the above-described embodiment and modifications. In addition, it is to be understood that the present disclosure is not limited to the above-described aspects but may be modified and practiced in different ways without departing from the spirit and scope of the present disclosure.

According to the present disclosure, it is possible to shorten a time to cool a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a substrate holder including a heat insulating part and a substrate holding part disposed above the heat insulating part and holding a plurality of substrates in multiple stages;
    a process chamber configured to process the plurality of substrates held by the substrate holding part;
    a transfer chamber adjacent to the process chamber and configured to transfer the plurality of substrates to the substrate holding part, the transfer chamber including a first wall and a second wall that is perpendicular to the first wall;
    a transfer mechanism configured to transfer the substrate holder;
    a first gas supply part installed on the first wall of the transfer chamber and configured to supply a gas into the transfer chamber;
    a second gas supply part that is a pipe installed on the second wall of the transfer chamber, along a horizontal direction in the transfer chamber at a height position between one of the plurality of substrates held at a lowermost stage of the substrate holding part and the heat insulating part, and that includes gas outlets configured to supply a gas in the horizontal direction toward the substrate holder; and a controller configured to control the transfer mechanism, the first gas supply part and the second gas supply part.

2. The substrate processing apparatus of claim 1, wherein the second gas supply part is installed so as to supply the gas between the substrate held at the lowermost stage of the substrate holding part and the heat insulating part.

3. The substrate processing apparatus of claim 2, wherein the gas outlets are formed by a plurality of openings.

4. The substrate processing apparatus of claim 3, wherein the gas outlets are formed in a region within a diameter range of each of the plurality of substrates.

5. The substrate processing apparatus of claim 2, further comprising: a third gas supply part having gas outlets at a height position equal to or higher than a height position of a top plate of the substrate holding part and configured to supply the gas into the transfer chamber.

6. The substrate processing apparatus of claim 2, wherein the controller is configured to control the transfer mechanism, the first gas supply part and the second gas supply part so as to supply the gas from the first gas supply part at a first flow velocity and supply the gas from the second gas supply part at a second flow velocity lower than the first flow velocity while transferring the substrate holder from the process chamber to the transfer chamber.

7. The substrate processing apparatus of claim 6, wherein the controller is configured to control the transfer mechanism, the first gas supply part and the second gas supply part so as to supply the gas from the first gas supply part at the first flow velocity and supply the gas from the second gas supply part at a third flow velocity that is lower than the first flow velocity when transferring the substrates from the substrate holder.

8. The substrate processing apparatus of claim 7, wherein the third flow velocity is equal to or higher than the second flow velocity.

9. The substrate processing apparatus of claim 8, wherein the second flow velocity is substantially zero.

10. The substrate processing apparatus of claim 2, wherein the controller is configured to control the transfer mechanism, the first gas supply part and the second gas supply part so as to supply the gas from the first gas supply part at a first flow velocity and supply the gas from the second gas supply part at a second flow velocity that is higher than the first flow velocity when lowering a temperature of the substrate in the transfer chamber.

11. The substrate processing apparatus of claim 2, wherein the controller is configured to control the transfer mechanism, the first gas supply part and the second gas supply part so as to set a flow rate of the gas supplied from the first gas supply part to the transfer chamber to be higher than a flow rate of the gas supplied from the second gas supply part to the transfer chamber when the substrate holder is present in the transfer chamber.

12. The substrate processing apparatus of claim 11, further comprising: a rotation mechanism configured to rotate the substrate holder, wherein the controller is configured to control the rotation mechanism, the first gas supply part and the second gas supply part so as to supply the gas from the first gas supply part and the second gas supply part to the transfer chamber and rotate the substrate holder when lowering a temperature of the substrate in the transfer chamber.

13. The substrate processing apparatus of claim 11, wherein the controller is configured to control the transfer mechanism, the first gas supply part and the second gas supply part so as to supply the gas from the first gas supply part at a first flow rate and supply the gas from the second gas supply part at a second flow rate lower than the first flow rate while transferring the substrate holder from the process chamber to the transfer chamber.

14. The substrate processing apparatus of claim 13, wherein the controller is configured to control the transfer mechanism, the first gas supply part and the second gas supply part so as to supply the gas from the first gas supply part at the first flow rate and supply the gas from the second gas supply part at a third flow rate higher than the second flow rate when lowering a temperature of the substrate in the transfer chamber.

15. The substrate processing apparatus of claim 14, wherein the controller is configured to control the transfer mechanism, the first gas supply part and the second gas supply part so as to supply the gas from the first gas supply part at the first flow rate and supply the gas from the second gas supply part at a fourth flow rate lower than the third flow rate and higher than the second flow rate when transferring the substrates from the substrate holder.

16. The substrate processing apparatus of claim 15, wherein the second flow rate is equal to the fourth flow rate.

17. A method of manufacturing a semiconductor device, comprising:

transferring a substrate holder that includes a heat insulating part and a substrate holding part disposed above the heat insulating part and holds a plurality of substrates in multiple stages from a transfer chamber having a first gas supply part that supplies a gas into a process chamber, the transfer chamber including a first wall and a second wall that is perpendicular to the first wall, and the first gas supply part being installed on the first wall of the transfer chamber;

processing the plurality of substrates in the process chamber;

unloading the substrate holder from the process chamber to the transfer chamber; and supplying the gas between one of the plurality of substrates held at a lowermost stage of the substrate holding part and the heat insulating part from a second gas supply part that is a pipe installed on the second wall of the transfer chamber, along a horizontal direction in the transfer chamber at a height position between the substrate held at the lowermost stage of the substrate holding part and the heat insulating part, the second gas supply part including gas outlets configured to supply the gas in the horizontal direction toward the substrate holder.

18. A non-transitory computer-readable recording medium storing a program that causes a substrate processing apparatus to perform a process by a computer, the process comprising:

transferring a substrate holder that includes a heat insulating part and a substrate holding part disposed above the heat insulating part and holds a plurality of substrates in multiple stages from a transfer chamber having a first gas supply part that supplies a gas into a process chamber, the transfer chamber including a first wall and a second wall that is perpendicular to the first wall, and the first gas supply part being installed on the first wall of the transfer chamber;

processing the plurality of substrates in the process chamber;

unloading the substrate holder from the process chamber to the transfer chamber; and supplying the gas between one of the plurality of substrates held at a lowermost stage of the substrate holding part and the heat insulating part from a second gas supply part that is a pipe installed on the second wall of the transfer chamber, along a horizontal direction in the transfer chamber at a height position between the substrate held at the lowermost stage of the substrate holding part and the heat insulating part, the second gas supply part including gas outlets configured to supply the gas in the horizontal direction toward the substrate holder.

* * * * *